United States Patent [19]

Takahashi

[11] Patent Number: 5,424,683
[45] Date of Patent: Jun. 13, 1995

[54] DIFFERENTIAL AMPLIFICATION CIRCUIT WHEREIN A DC LEVEL AT AN OUTPUT TERMINAL IS AUTOMATICALLY ADJUSTED AND A POWER AMPLIFIER WHEREIN A BTL DRIVE CIRCUIT IS DRIVEN BY A HALF WAVE

[75] Inventor: Yoshiaki Takahashi, Ora, Japan

[73] Assignee: Sanyo Electric Co., Ltd., Osaka, Japan

[21] Appl. No.: 210,152

[22] Filed: Mar. 16, 1994

[30] Foreign Application Priority Data

Mar. 29, 1993 [JP] Japan ............... 5-069916
Jul. 7, 1993 [JP] Japan ............... 5-167864

[51] Int. Cl.6 .................................. H03F 3/45
[52] U.S. Cl. ........................... 330/255; 330/259
[58] Field of Search ........... 307/494, 540; 330/255, 330/259, 260, 265, 267

[56] References Cited

U.S. PATENT DOCUMENTS 4,107,619 8/1978 Pass .................... 330/255
5,254,956 10/1993 Nishijima ........... 330/259 X Primary Examiner—Steven J. Mottola
Attorney, Agent, or Firm—Spensley Horn Jubas & Lubitz

[57] ABSTRACT

A power amplifier with highly efficient power consumption with fewer switching power supplies. The power amplifier comprises a first differential amplifier having two input terminals and a common terminal, a BTL amplifier consisting of a first SEPP OCL and a second SEPP OCL, a nonlinear adder, an adder, a second differential amplifier, and a switching power supply.

8 Claims, 10 Drawing Sheets

DIFFERENTIAL AMPLIFICATION CIRCUIT WHEREIN A DC LEVEL AT AN OUTPUT TERMINAL IS AUTOMATICALLY ADJUSTED AND A POWER AMPLIFIER WHEREIN A BTL DRIVE CIRCUIT IS DRIVEN BY A HALF WAVE

BACKGROUND OF THE INVENTION

1. Field of the Invention

This invention relates to an amplifier appropriate for an output stage, etc., of an audio amplifier.

2. Description of the Related Art

FIG. 1 shows an example of a conventional power amplifier. Shown in FIG. 1 is a generally used OCL (output capacitorless) complementary SEPP (symmetrical single-ended push-pull) circuit, wherein IN is an input terminal to which an input signal from the preceding stage is applied and A is an amplifier. One input terminal + of the amplifier A is connected to the input terminal IN and is also grounded via a resistor Rg; the other terminal − is grounded via a resistor Re.

+B and −B are power supplies of opposite polarity to each other and Q1 and Q2 are output transistors of opposite polarity to each other. Q1 is an npn transistor and Q2 is a pnp transistor. The power supplies +B and −B are connected to the collectors of the transistors Q1 and Q2 so that they become forward bias polarities with respect to the transistors Q1 and Q2 respectively. That is, the positive electrode of the power supply +B is connected to the collector of the transistor Q1 and the negative electrode of the power supply −B to the collector of the transistor Q2. OUT is an output terminal and RL is a load connected to the output terminal OUT.

A complementary symmetrical circuit consisting of the transistors Q1 and Q2 has bases connected in common to provide a signal input terminal, which is connected to an output terminal of the amplifier A, and emitters connected in common to provide a signal output terminal, which is connected via a resistor Rf to the input terminal of the amplifier A and is also connected to the output terminal OUT. In the circuit, the transistor Q1 or Q2 operates as an emitter follower in response to the positive or negative polarity of an input.

An input signal from the preceding stage is applied to the input terminal IN and is amplified by the amplifier A and further the output of the amplifier A is amplified by the output transistors Q1, Q2 at the following stage, then the result is supplied to the load RL. That is, the current flowing into the output transistors flows into the load RL.

However, at such a power amplifier, a value resulting from adding a voltage loss at transistors, etc., to the maximum output voltage is required as a supply voltage. The supply voltage minus the output voltage is applied between the collector and emitter of the output transistor and power resulting from multiplying the voltage value by output current becomes a power loss at the output transistor. Collector-emitter voltage $V_{CE}$ at the maximum output differs from that at the normal operation. When the collector-emitter voltage is large, a power loss at the output transistor becomes great, heating the output transistor. Thus, expensive transistors or cooling means for coping with the heating is required. Also, the collector-emitter withstand voltage of the output transistor needs to be at least twice as high as the supply voltage.

Then, an amplifier has been proposed where a formerly fixed supply voltage from a power supply is made variable and a supply voltage responsive to an input signal level is supplied, thereby reducing a collector loss. FIG. 2 shows such a power amplifier having positive and negative power supplies. A first SW (switching) power supply 4 and a second SW power supply 5 are connected to collectors of a first transistor 2 and a second transistor 3 to which output signals of a power amplifier 1 are applied. An output signal generated at a terminal 7 of a load 6 is applied via a direct current power supply for level shift, 8 or 9, to a first or second control circuit 10 or 11.

Now assume that an output signal indicated by a dotted line in FIG. 3 is generated at the load 6. During the period of a positive half cycle of the output signal, the first control circuit 10 turns on/off a switch 12 so as to generate a supply voltage $V_{BA}$ of size responsive to the level of the output signal as denoted by a solid line in FIG. 3. The switching ratio of the switch 12, i.e. the duty cycle of the output signal from the switch 12 is adjusted to determine the voltage of a capacitor C. A ripple filter is formed by the capacitor C and a coil L. A diode D is provided to set the end of the coil L on the side of the switch 12 to a ground potential when the switch 12 is turned off. The second control circuit 11 holds the output supply voltage $V_{BB}$ value small at a given level in response to the fact that the output signal is positive. In contrast, when the output signal generated at the load 6 enters a negative half cycle, the first control circuit 10 holds the supply voltage $V_{BA}$ constant and the second control circuit 11 changes the supply voltage $V_{BB}$ in response to the output signal level. As a result, the supply voltages $V_{BA}$ and $V_{BB}$ change as denoted by solid lines in FIG. 3. As seen from FIG. 3, the supply voltages change following the level of the output signal indicated by the dotted line, thus the collector-emitter voltages $V_{CE}$ of the first and second transistors 2 and 3 are always maintained at constant values Vx (values of the DC power supplies 8 and 9), and a collector loss can be suppressed.

By the way, for light weight, a configuration of a single power supply with no output transformer is required for a power amplifier for car audio, etc. Thus, a BTL (balanced transformerless) drive circuit is generally used. FIG. 4 shows a power amplifier of a single power supply using SW power supplies with a BTL drive. The power amplifier shown in FIG. 4 basically has two units in FIG. 2 at the left and right. A second power amplifier 13 inverts an input signal and applies the resultant signal to a load 6. Thus, AC signals of opposite phase to each other are applied to both ends of the load 6, as shown in FIGS. 5 and 6. The signal indicated by a dotted line in FIG. 5 is generated on the terminal 7 side of the load 6 and the signal indicated by a dotted line in FIG. 6 is generated on the terminal 14 side of the load 6. Supply voltages $V_{BA}$ and $V_{BB}$ generated at collectors of first and second transistors 2 and 3 are indicated by solid lines in FIG. 5. Supply voltages $V_{BC}$ and $V_{BD}$ generated at collectors of third and fourth transistors 15 and 16 are indicated by solid lines in FIG. 6.

Therefore, power amplification of the BTL driver with less power consumption can be performed according to the circuit shown in FIG. 4.

In the examples given above, the load RL 6 is a loudspeaker, into which a current flows to generate sound.

However, the power amplifier in FIG. 4 requires four SW power supplies. Choke coils required at the SW power supplies are expensive and become noise sources because they generate a strong magnetic field during the switching operation. Thus, reduction of the number of SW power supplies has been desired.

SUMMARY OF THE INVENTION

Accordingly, it is an object of the invention to provide a stable output DC level even if the output DC level of a differential amplifier changes upward or downward.

It is another object of the invention to provide a power amplifier which enables a collector loss of an output transistor to be reduced and has a simple configuration with no crossover distortion.

To these ends, according to the invention, there is provided a differential amplification circuit where a DC level at an output terminal is automatically adjusted, the circuit comprising:

a first differential amplifier comprising two input terminals, two output terminals, and a common input terminal for determining DC levels of the two output terminals for amplifying an AC signal input as the difference between the two input terminals and outputting to the two output terminals as output signals of opposite polarities to each other;

a negative feedback circuit for applying negative feedback of mutually equal size between one of the two input terminals and one of the two output terminals and between the other of the two input terminals and the other of the two output terminals;

a nonlinear adder for substantially adding two output signals generated at the two output terminals and clamping a change in the result of the addition to a predetermined value or less; and a second differential amplifier for applying a comparison output signal responsive to the difference between an output signal of the nonlinear adder and a reference voltage of a reference power supply to the common input terminal of the first differential amplifier.

According to the invention, nonlinear addition processing of outputs of the differential amplifier is performed. The output DC level of the differential amplifier is determined in response to the result of the nonlinear addition processing. Thus, the output DC level can be changed following an output change. Since the output change of the nonlinear adder is limited to a predetermined value or less, a half-wave output can be provided in response to a signal change. Then, the output can be used to perform as a preferred BTL drive.

In the differential amplification circuit, the first differential amplifier has a pair of transistors for dividing a current from one constant current source, the current amount of the pair of transistors changing according to signals from the two input terminals, and is responsive to an input signal from the common input terminal for changing the sum of current amounts supplied to two transistors from the constant current source.

This enables efficient changing of the DC voltage level at the output.

The nonlinear adder includes a pair of resistors connected in series and a pair of diodes connected in series in opposite directions to each other, the pair of resistors and the pair of diodes having both ends connected to the two output terminals and intermediate points of connection of the resistors and that of the diodes connected to the second differential amplifier.

Two outputs of the first differential amplifier are input to a pair of push-pull output stages and BTL drive of a load is performed by the output of the pair of push-pull amplification stages.

The BTL drive which enables the maximum power to be provided largely with a single power supply can be used by the configuration. The BTL drive is driven by a half wave rather than a normal sine wave, thereby accomplishing efficient power consumption by using only one switching power supply.

Since the BTL amplifier is operated in response to output signals of one differential amplifier, only one signal path is required and crossover distortion of output signals occurring at the load can be reduced.

Each of time pair of push-pull output stages has a pair of transistors of opposite polarity to each other connected in series between time power supply and ground. The load is connected between a connection point of the pair of transistors of one push-pull output stage and a connection point of the pair of transistors of the other push-pull output stage.

A switching power supply is further included for changing the power supply of the pair of push-pull output stages in response to a signal supplied to the load.

The nonlinear adder adds signals at both ends of the load.

Two bias circuits each for adjusting a DC level of an input signal to the push-pull output stage are further disposed between the two output terminals of the first differential amplifier and the pair of push-pull output stages.

DESCRIPTION OF THE PREFERRED EMBODIMENTS

Referring now to the accompanying drawings, there are shown preferred embodiments of the invention.

Figure 1:
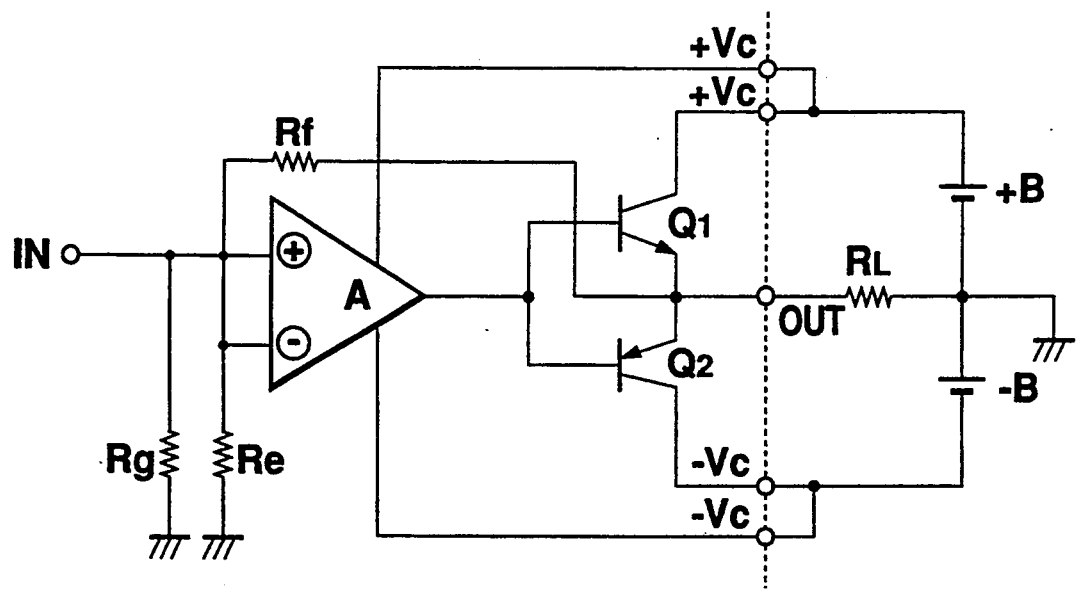
FIG. 1 is a circuit diagram showing a conventional power amplifier.
Figure 2:
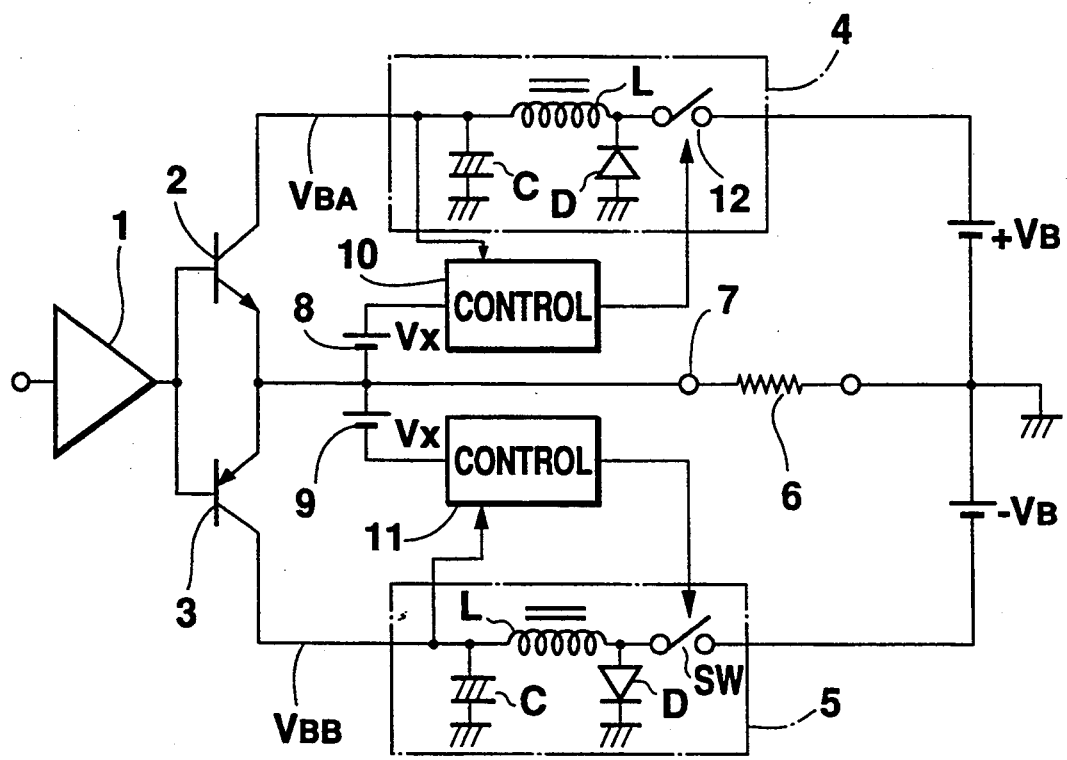
FIG. 2 is a circuit diagram showing a conventional power amplifier.
Figure 3:
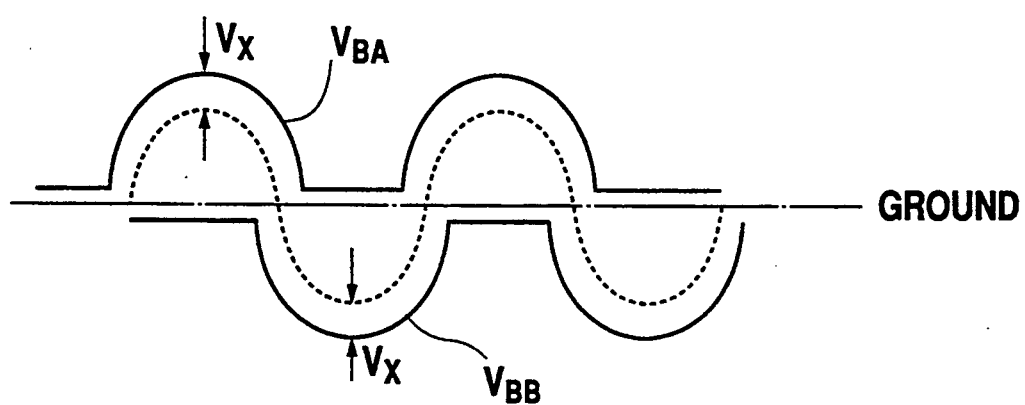
FIG. 3 is a waveform chart for description of FIG. 2.
Figure 4:
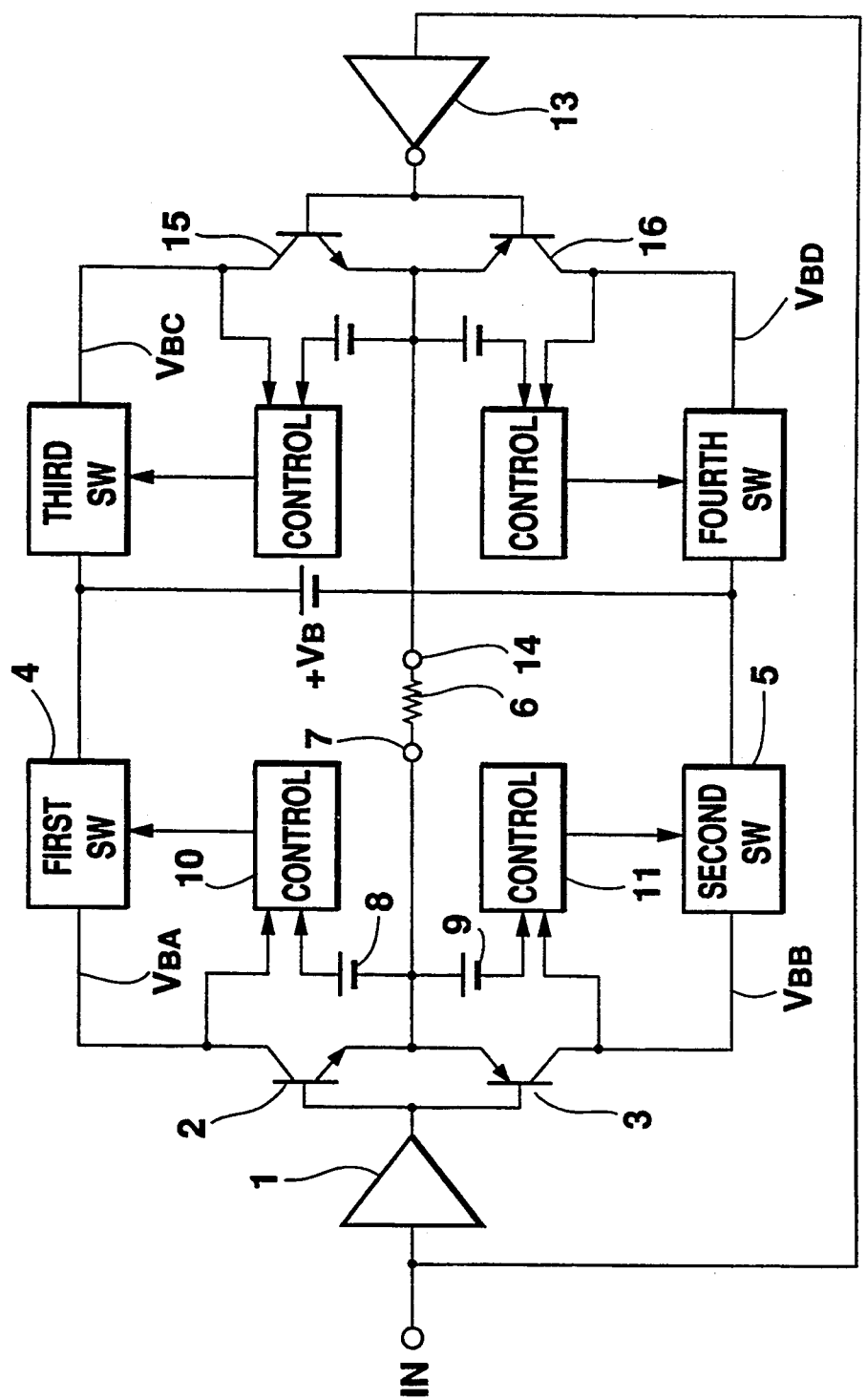
FIG. 4 is a circuit diagram showing a conventional power amplifier.
Figure 5:
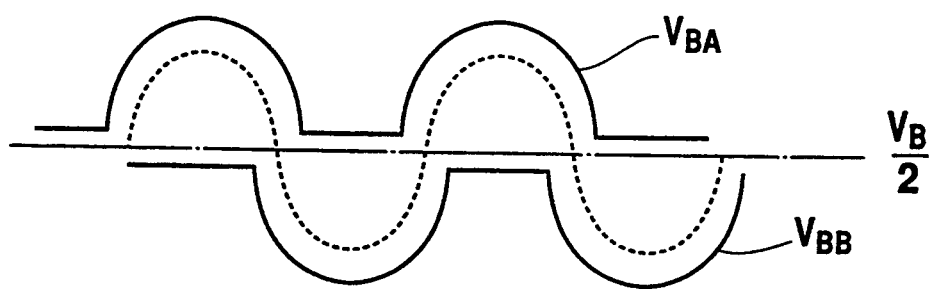
FIG. 5 is a waveform chart for description of FIG. 4.
Figure 6:
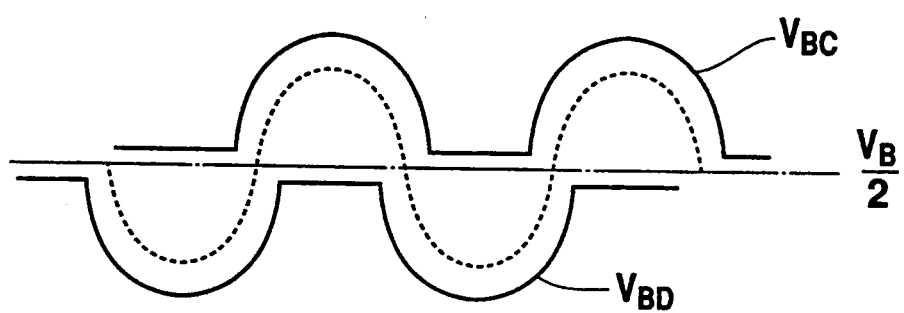
FIG. 6 is a waveform chart for description of FIG. 4.
Figure 7:
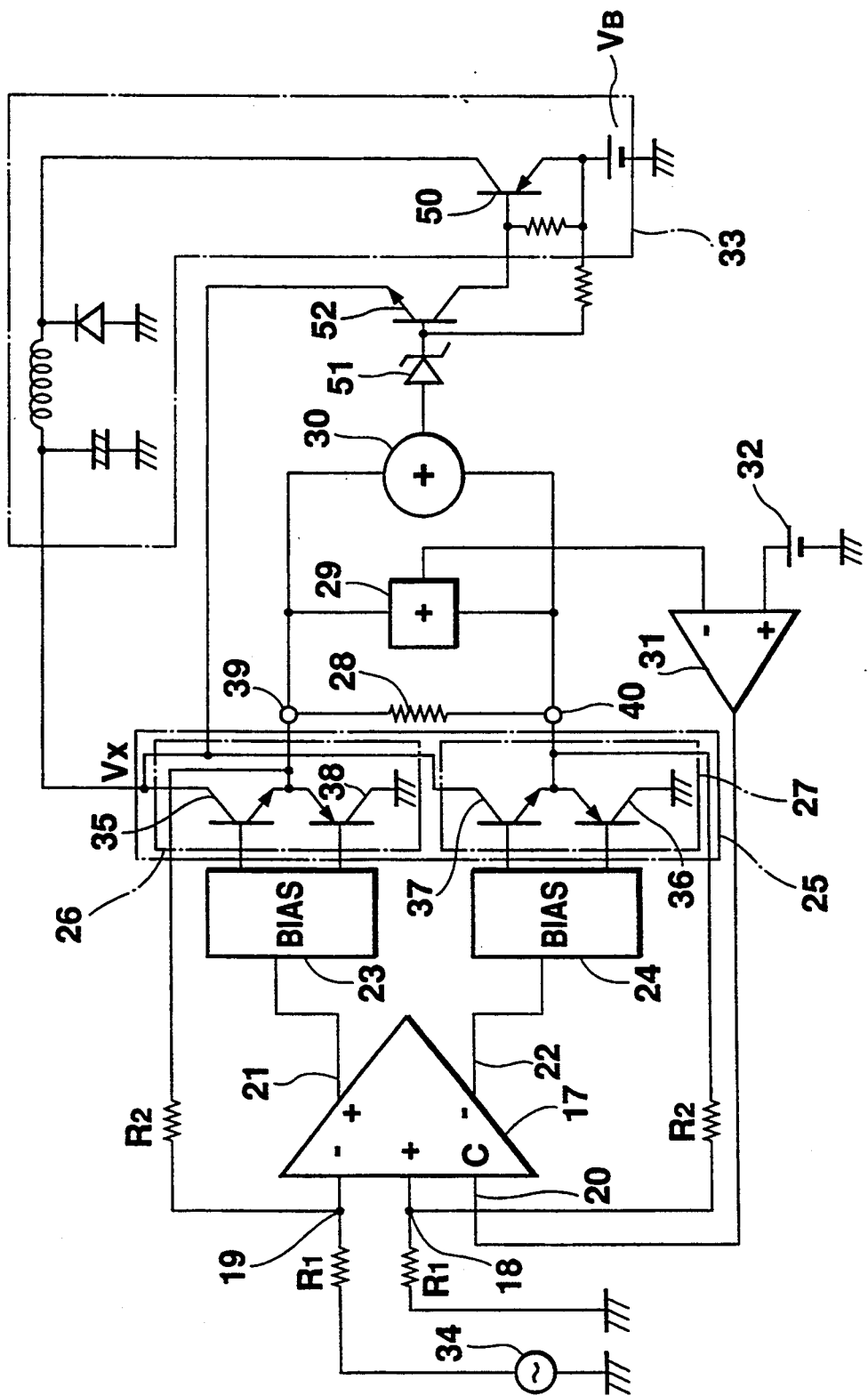
FIG. 7 is a circuit diagram showing a power amplifier according to the invention.

FIG. 7 is a circuit diagram showing one embodiment of the invention, wherein numeral 17 is a first differential amplifier which comprises positive and negative input terminals 18 and 19, a common terminal 20 for setting a DC level of an output signal, and positive and negative output terminals 21 and 22, and amplifies an input signal through one input terminal according to a gain determined by the ratio of two resistors R1 and R2. Numerals 23 and 24 are bias circuits to which two output signals of opposite phase to each other of the first differential amplifier 17 are applied, numeral 25 is a BTL amplifier which is made up of a first SEPP OCL (single-ended push-pull output capacitorless) 26 and a second SEPP OCL 27 and drives a load 28. Numeral 29 is a nonlinear adder which performs an addition operation if the level of two output signals generated across the load 28 is equal to or less than a predetermined value and performs a clamp operation between input and output terminals if the level is greater than the predetermined value. Numeral 30 is an adder which adds two output signals generated across the load 28. Numeral 31 a second differential amplifier which applies a comparison output signal responsive to the difference between an output signal of the nonlinear adder 29 and a reference voltage of a reference power supply 32 to the common terminal 20 of the first differential amplifier. Numeral 33 is a switching power supply for applying a supply voltage whose level changes in response to the output signal level of the adder 30 to the BTL amplifier 25.

An input signal from a signal source 34 in FIG. 7 (an AC signal from the preceding stage) is applied to an inversion input terminal 19 of the first differential amplifier 17, which then amplifies the signal and generates two output signals of opposite phase to each other at the output terminals 21 and 22. The two output signals are applied via the bias circuits 23 and 24 to the first SEPP OCL 26 and the second SEPP OCL 27. On the operation of the transistors constituting the first SEPP OCL 26 and the second SEPP OCL 27, when both the first and second transistors 35 and 36 are on, both the third and fourth transistors 37 and 38 are turned off; when both the third and fourth transistors 37 and 38 are turned on, both the first and second transistors 35 and 36 are turned off.

Figure 8:
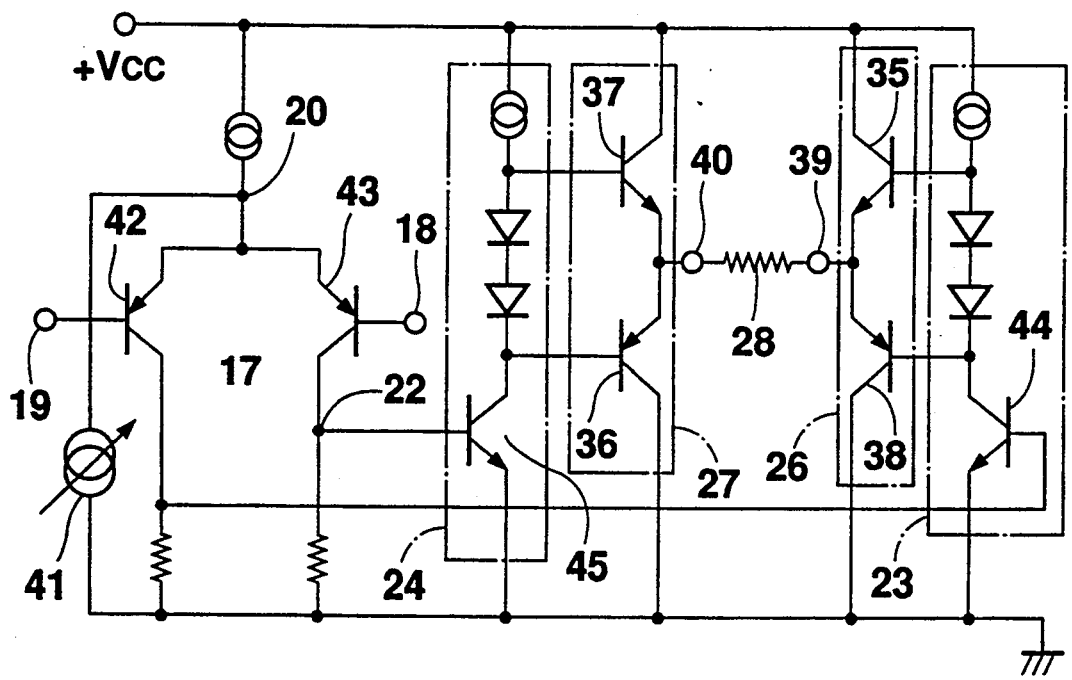
FIG. 8 is a specific circuit diagram of the circuit in FIG. 7.

FIG. 8 shows a specific circuit diagram of the first differential amplifier 17, the bias circuits 23 and 24, and the BTL amplifier 25 in FIG. 7. Circuit parts identical with those previously described with reference to FIG. 7 are denoted by the same reference numerals in FIG. 8.

Figure 9:
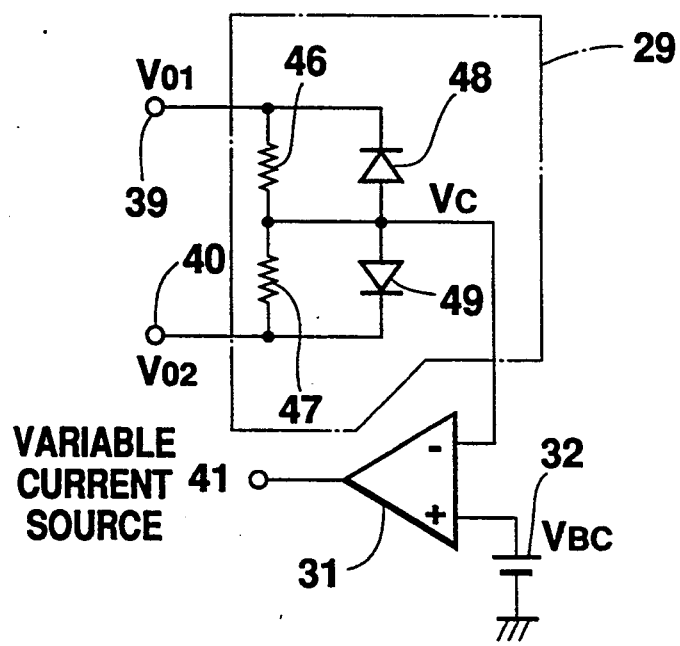
FIG. 9 is a specific circuit example of a nonlinear adder in FIG. 7.
Figure 10:
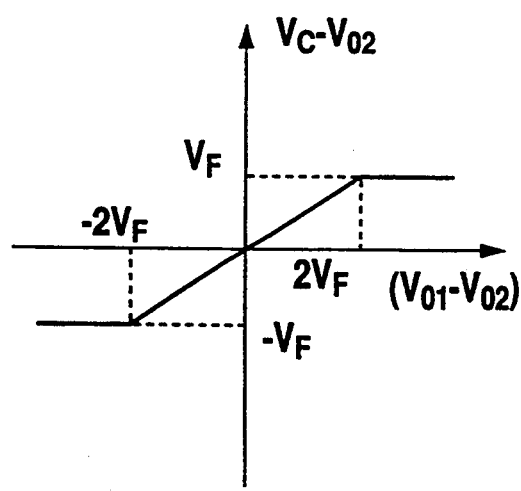
FIG. 10 is a waveform chart for description of FIG. 9.

Next, how the DC voltages of terminals 39 and 40 are determined will be described. The DC voltages of the terminals 39 and 40 are determined by a feedback loop made up of the nonlinear adder 29 and the second differential amplifier 31. FIG. 9 shows a specific circuit of the nonlinear adder 29. An output signal of the second differential amplifier 31 in FIG. 9 controls a current value of a variable current source 41 in FIG. 8. When the current value of the variable current source 41 is changed, DC current flowing through the emitter-collector paths of transistors 42 and 43 changes and base voltages of transistors 44 and 45 contained in the bias circuits 23 and 24 change. As a result, base voltages of the first to fourth transistors 35-38 change and DC voltage levels of the terminals 39 and 40 change equally. Two input terminals of the second differential amplifier 31 in FIG. 9 are imaginary short and feedback operation is performed so that the levels of two input signals become equal to each other. Then, voltage $V_C$ equals voltage $V_{BC}$ and at the same time, the DC level of voltages $V_{01}$ and $V_{02}$ also equals the voltage $V_{BC}$. That is, resistors 46 and 47 in FIG. 9 serve to accomplish the feedback operation. Diodes 48 and 49 in FIG. 9 are provided to prevent the difference between the voltages $V_{01}$ and $V_{02}$ of the terminals 39 and 40 and the voltage $V_{BC}$ from falling below the forward voltage of the diode, $V_F$. FIG. 10 shows the input/output characteristic of the circuit in FIG. 9. As seen from FIG. 10, when the voltage $V_{01}$ is near the voltage $V_{02}$ (the absolute value of "$V_{01}$ minus $V_{02}$" is 2 $V_F$ or less), the circuit in FIG. 9 operates as an adder; otherwise, the circuit operates as a clamp circuit. That is, since the slope is ½ in the section where the value is 2 $V_F$ or less, the circuit operates as an adder of $V_C = \frac{1}{2} (V_{01} + V_{02})$.

Therefore, the DC voltages of the terminals 39 and 40 in FIG. 7 can be determined as desired in response to the voltage of the reference power supply 32, $V_{BC}$.

The invention is characterized by the fact that the load 28 is driven by a half-wave signal. Thus, the voltage value of the reference power supply 32 is set to a low value near the ground level as shown in (a) and (b) of FIG. 11.

Figure 11:
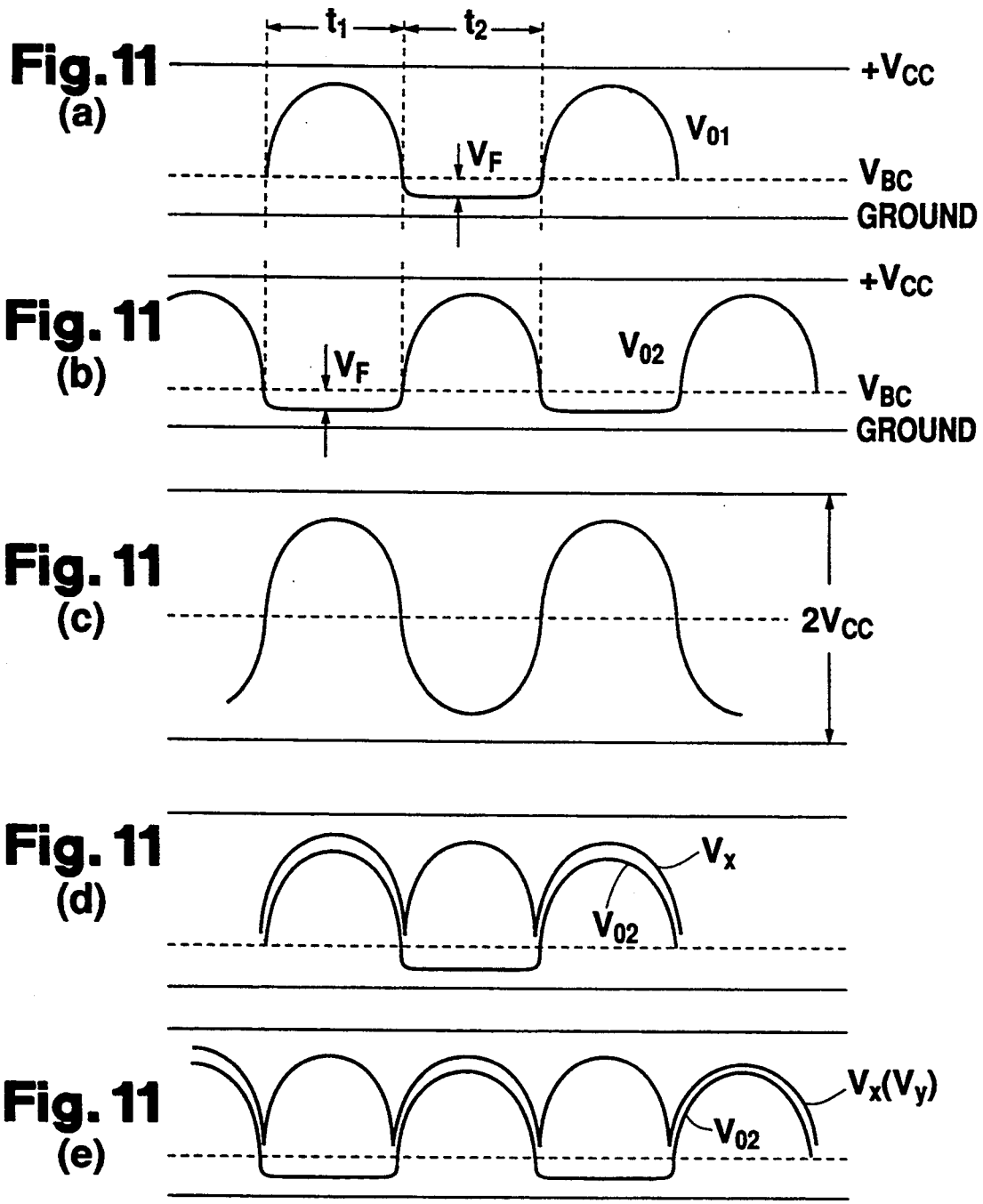
FIGS. 11a, 11b, 11c, 11d and 11e are waveform charts for description of FIG. 7.

Assume in this state that an AC signal is input to the input terminal 19 and that both the first and second transistors 35 and 36 are turned on. Then, a current flows from the terminal 39 into the terminal 40; the voltage of the terminal 39 rises from the DC voltage $V_{BC}$ and the voltage of the terminal 40 lowers from the DC voltage $V_{BC}$, but does not fall below the voltage ($V_{BC} - V_F$) in response to the clamp operation of the nonlinear adder 29, and the voltage of the terminal 39 rises in response to the signal level, as shown as time $t_1$ in (a) and (b) of FIG. 11. (a) of FIG. 11 shows the voltage level of the terminal 39; at time $t_1$, a half cycle of the signal develops. (b) of FIG. 11 shows the voltage level of the terminal 40; at time $t_1$ during which a negative half cycle should develop, the voltage is clamped to the level at which it lowers by voltage $V_F$ from voltage $V_{BC}$ ($V_{BC} - V_F$).

As seen from time $t_1$ in (a) and (b) of FIG. 11, the load is driven by the first and second transistors 35 and 36 which perform B-class operation.

Next, assuming that time $t_2$ in FIG. 11 is entered, then both the third and fourth transistors 37 and 38 are turned on and a current flows from the terminal 40 into the terminal 39. This operation is performed as described above; clamped voltage develops in (a) of FIG. 11 and a signal develops in (b) of FIG. 11.

Therefore, the load 28 is driven by a half-wave signal from both ends rather than a sine wave signal. Since the output signal generated at the load 28 is an AC component developing between both ends of the terminals 39 and 40, the AC signal of (c) of FIG. 11 resulting from subtracting voltage $V_{02}$ from voltage $V_{01}$ is output.

The circuit in FIG. 9 will be described in more detail.

Figure 14:
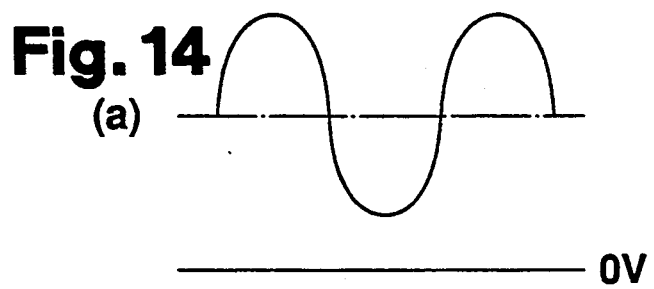
FIG. 14a, 14b and 14c are waveform charts for description of FIG. 9.
Figure 14:
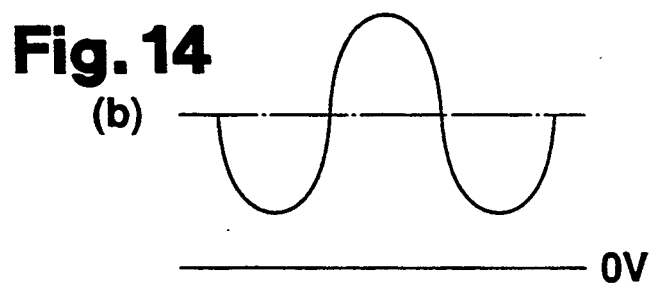
Figure 14:
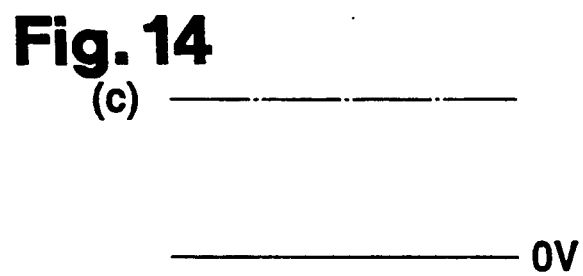

Now assume that sine waves of opposite polarities to each other as shown in (a) and (b) of FIG. 14 develop at the terminals 39 and 40 in FIG. 7. The AC components indicated by solid lines in FIG. 14 are canceled by the operation of the resistors 46 and 47 in FIG. 9 and the DC components indicated by alternate long and short dash lines in FIG. 14 are added, resulting in the waveform shown in (c) of FIG. 14; the voltage in (c) of FIG. 14 equals the DC voltage $V_{BC}$. At this time, the diodes 48 and 49 in FIG. 9 do not operate.

Next, assume that the diodes 48 and 49 in FIG. 9 do not exist and that in this state, signals whose DC level deviates as shown in (a) and (b) of FIG. 11 are generated at the terminals 39 and 40 in FIG. 7. If the diodes 48 and 49 do not exist, a voltage like the voltage $V_y$ in (e) of FIG. 11 is applied to the second differential amplifier in FIG. 9.

However, since the second differential amplifier 31 controls so that the voltage $V_y$ equals the DC voltage $V_{BC}$, output DC voltage of the first differential amplifier 17 is not stably determined.

Then, in the invention, the diodes 48 and 49 in FIG. 9 are provided to perform a clip operation for determining the DC voltage.

The diodes 48 and 49 in the embodiment in FIG. 9 may have their cathodes and anodes in the opposite directions. In this case, however, the no-signal level $V_{BC}$ shown in (a) and (b) of FIG. 11 becomes near the supply voltage ($+V_{CC}$) level.

The operation of the diodes 48 and 49 in FIG. 9 is effective for the first and second differential amplifiers 17 and 31, in which case the power supply need not be a switching power supply.

To reduce power consumption at the circuit in FIG. 7, an analogous supply voltage with respect to an input signal needs only to be applied to the collector-emitter path of a transistor whose voltage $V_{CE}$ changes greatly in response to the input signal. Then, in the invention, voltages generated across the load 28, $V_{01}$ and $V_{02}$, are detected and added by the adder 30, and the resultant signal ($V_{01}+V_{02}$) causes a transistor switch 50 of the switching power supply 33 to be turned on or off. Then, the voltage $V_x$ in (d) of FIG. 11 develops at the output terminal of the switching power supply 33. That is, a voltage analogous to $V_x$ in (d) of FIG. 11 is generated at the output of the adder 30 in FIG. 7 and drives Tr52 via a level shift diode 51. Then, Tr52 in turn drives Tr50 and a voltage from a battery $V_B$ is smoothed through a low-pass filter (LPF) consisting of a coil L and a capacitor C: Output voltage ($V_x$) of the capacitor C changes in response to conductivity of Tr50. Since the voltage $V_x$ in (d) of FIG. 11 is generated based on the voltage developing across the load 28, the supply voltage value securely responsive to the output signal level can be generated, leading to stable reduction of power consumption. A Zener diode 51 is used for level shift. As seen from (d) of FIG. 11, the voltage $V_x$ analogous to the signal voltage $V_{01}$ is applied to the collector of the first transistor 35; it is obvious that the collector loss of the first transistor 35 is slight ($V_x-V_{01}$).

(e) of FIG. 11 shows a supply voltage change with respect to the signal in (b) of FIG. 11; it is obvious that all the change in the supply voltage $V_x$ is used effectively.

Therefore, the circuit in FIG. 7 provides a power amplifier of a single power supply with less power consumption.

Generally, a time responsiveness of a switching power supply is restricted and may be unable to follow signals (on/off signals) which change rapidly. In such a case, there is a chance that the first and third transistors 35 and 37 will be saturated. Then, in the invention, the transistor 52 is provided to prevent the collector voltages of the first and third transistors 35 and 37 from lowering.

Figure 12:
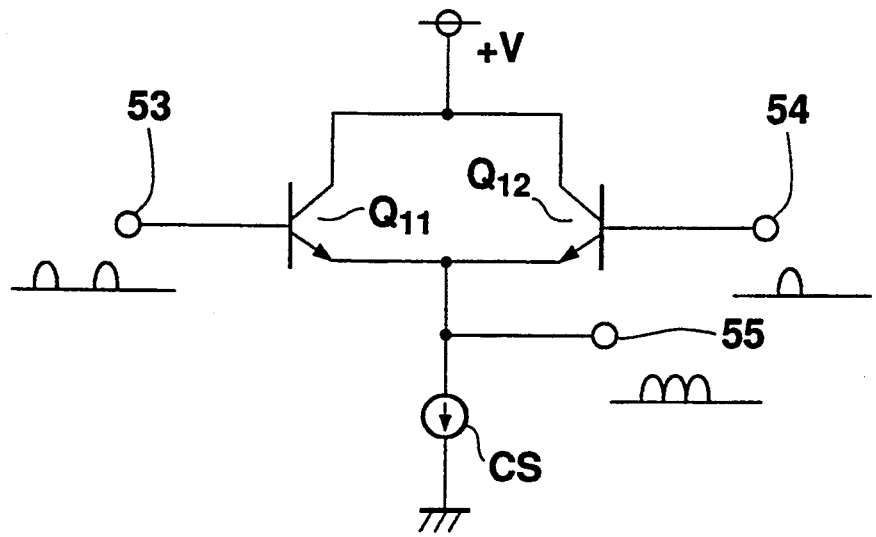
FIG. 12 is a specific circuit diagram of an adder in FIG. 7.

FIG. 12 shows a specific circuit example of the adder 30, wherein positive signals of signals applied to input terminals 53 and 54 are added and output through an output terminal 55.

Figure 13:
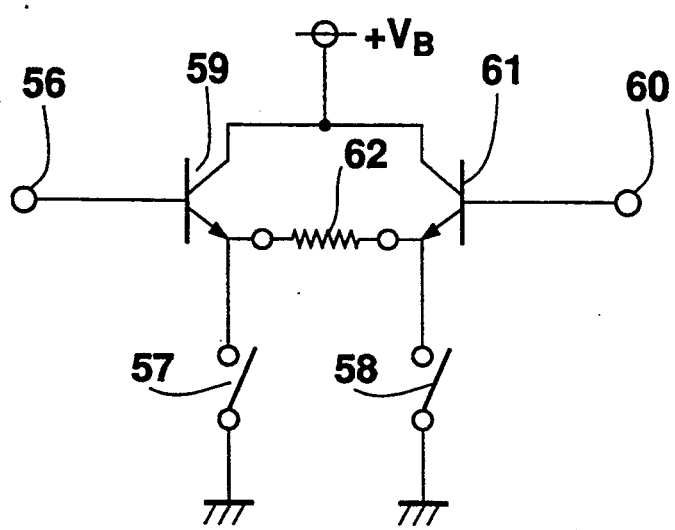
FIG. 13 is a circuit diagram showing another embodiment of the invention.

By the way, a method as shown in FIG. 13 as well as the BTL drive as shown in FIG. 7 may be used, when switch 57 is turned off and a second switch 58 is turned on, causing a current to flow from the emitter of a first transistor 59 into the second switch 58. In contrast, if a positive half-wave signal is applied to an input terminal 60, the first switch 57 is turned on and the second switch 58 is turned off, causing a reverse current to flow from a second transistor 61 into a load 62. In such a manner, the load 62 may be driven by half-wave signals.

As described above, according to the embodiment, a power amplifier with a small collector loss and highly efficient and stable power consumption can be provided simply by using a single switching power supply.

Particularly according to the embodiment, the load is driven based on a single differential amplifier and therefore output signals with no crossover distortion can be provided even if it is driven by half waves.

Further, the output DC level of the differential amplifier can be stably set to any desired value regardless of the level.

What is claimed is:

1. A differential amplification circuit wherein a DC level at an output terminal is automatically adjusted, said circuit comprising:
   a first differential amplifier comprising two input terminals, two output terminals, and a common input terminal for determining DC levels of said two output terminals for amplifying an AC signal input as a difference between said two input terminals and outputting to said two output terminals output signals of opposite polarity to each other;
   a negative feedback circuit for applying negative feedback of mutually equal size between one of said two input terminals and one of said two output terminals and between the other of said two input terminals and the other of said two output terminals;
   a nonlinear adder for substantially adding two output signals generated at said two output terminals and clamping a change in the result of the addition to a predetermined value or less; and
   a second differential amplifier for applying a comparison output signal responsive to a difference between an output signal of said nonlinear adder and a reference voltage of a reference power supply to said common input terminal of said first differential amplifier.

2. The differential amplification circuit as claimed in claim 1 wherein said first differential amplifier has a pair of transistors for dividing and flowing a current from one constant current source, the current amount of said pair of transistors changing according to signals from said two input terminals, and is responsive to an input signal from said common input terminal for changing the sum of current amounts supplied to two transistors from said constant current source.

3. The differential amplification circuit as claimed in claim 1 wherein said nonlinear adder includes a pair of resistors connected in series and a pair of diodes connected in series in opposite directions to each other, said pair of resistors and said pair of diodes having one end connected to each of said two output terminals and intermediate points of connection of the resistors and the diodes connected to said second differential amplifier.

4. The differential amplification circuit as claimed in claim 1 wherein two outputs of said first differential amplifier are input to a pair of push-pull output stages and BTL drive of a load is performed by output of said pair of push-pull amplification stages.

5. The differential amplification circuit as claimed in claim 4 wherein each of said pair of push-pull output stages has a pair of transistors of opposite polarity to each other connected in series between power supply and ground and the load is connected between a connection point of said pair of transistors of one push-pull output stage and a connection point of said pair of transistors of the other push-pull output stage.

6. The differential amplification circuit as claimed in claim 5 further including a switching power supply for changing a power supply of said pair of push-pull output stages in response to a signal supplied to said load.

7. The differential amplification circuit as claimed in claim 6 wherein said nonlinear adder adds signals at both ends of said load.

8. The differential amplification circuit as claimed in claim 7 wherein two bias circuits each for adjusting a DC level of an input signal to the push-pull output stage are further disposed between said two output terminals of said first differential amplifier and said pair of push-pull output stages.

* * * * *